(12) United States Patent
Soga et al.

(10) Patent No.: US 9,431,439 B2
(45) Date of Patent: Aug. 30, 2016

(54) LIGHT DETECTOR

(71) Applicant: KABUSHIKI KAISHA TOYOTA CHUO KENKYUSHO, Nagakute-shi, Aichi-ken (JP)

(72) Inventors: Mineki Soga, Nisshin (JP); Cristiano Niclass, Nisshin (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 257 days.

(21) Appl. No.: 14/054,114

(22) Filed: Oct. 15, 2013

(65) Prior Publication Data

US 2014/0103196 A1    Apr. 17, 2014

(30) Foreign Application Priority Data

Oct. 16, 2012   (JP) ................. 2012-228619

(51) Int. Cl.
| | |
|---|---|
| H01L 27/144 | (2006.01) |
| G01S 7/486 | (2006.01) |
| H01L 31/02 | (2006.01) |
| H01L 31/107 | (2006.01) |

(52) U.S. Cl.
CPC ......... *H01L 27/144* (2013.01); *G01S 7/4865* (2013.01); *H01L 31/02019* (2013.01); *H01L 31/107* (2013.01)

(58) Field of Classification Search
CPC ........... H01L 27/144; H01L 31/02019; H01L 31/107; H01L 31/09; H01L 31/02027; G01S 7/4865; G01S 17/10; G01S 7/497; G01S 17/89; G01S 7/487; G01S 7/4861; G01S 7/4863; G01S 7/4868; G01S 17/026; G01S 17/08; G01S 17/105; G01S 17/93; G01S 17/936; G01T 1/18; G01T 1/248; G01J 1/44; G01J 2001/442; G01C 3/08; H04N 5/378; H01J 40/14

USPC ................. 250/214 R, 208.1, 214.1, 339.11; 356/5.01

See application file for complete search history.

(56) References Cited

U.S. PATENT DOCUMENTS

| | | | |
|---|---|---|---|
| 8,243,874 B2 * | 8/2012 | Carmi ................. | G01T 1/2985 250/366 |
| 8,519,340 B2 * | 8/2013 | Frach .................. | G01T 1/2018 250/362 |
| 8,884,213 B2 * | 11/2014 | Grazioso ............. | G01T 1/202 250/252.1 |

(Continued)

FOREIGN PATENT DOCUMENTS

| | | |
|---|---|---|
| JP | A-4-36682 | 2/1992 |
| JP | A-07-067043 | 3/1995 |

(Continued)

OTHER PUBLICATIONS

Mar. 31, 2015 Office Action issued in Japanese Application No. 2012-228619.

(Continued)

*Primary Examiner* — John Lee
(74) *Attorney, Agent, or Firm* — Oliff PLC

(57) ABSTRACT

There is provided a light detector having a light-receiving unit including a light-receiving element of a photon-counting type that receives incident light and outputs a binary pulse indicating presence or absence of photon incidence, and an integrating unit that calculates an output value in which a total of pulse widths of pulses is integrated over a measurement period.

6 Claims, 7 Drawing Sheets

(56) References Cited

U.S. PATENT DOCUMENTS

| | | | | |
|---|---|---|---|---|
| 8,921,754 | B2* | 12/2014 | Frach | G01T 1/2018 250/214 AG |
| 2006/0202129 | A1* | 9/2006 | Niclass | G01T 1/248 250/370.14 |
| 2009/0235127 | A1* | 9/2009 | Ohishi | G01S 7/487 714/700 |
| 2011/0073764 | A1* | 3/2011 | Woldemichael | G01T 1/1647 250/362 |
| 2011/0080510 | A1 | 4/2011 | Nishihara | |
| 2012/0081589 | A1 | 4/2012 | Nishihara | |
| 2012/0138774 | A1* | 6/2012 | Kelly | G11B 20/00086 250/208.1 |
| 2012/0154187 | A1* | 6/2012 | Dutton | H03M 7/165 341/118 |
| 2012/0228484 | A1* | 9/2012 | Burr | G01T 1/248 250/252.1 |
| 2012/0305786 | A1* | 12/2012 | Dierickx | G01J 1/44 250/371 |
| 2013/0009047 | A1* | 1/2013 | Grazioso | G01T 1/248 250/252.1 |
| 2013/0077848 | A1* | 3/2013 | Yamada | G01T 1/1644 382/131 |
| 2013/0114073 | A1 | 5/2013 | Namba et al. | |
| 2013/0214168 | A1* | 8/2013 | McDaniel | G01T 1/2985 250/362 |
| 2013/0299677 | A1 | 11/2013 | Nishihara | |
| 2014/0021356 | A1* | 1/2014 | Zwaans | G01T 1/2985 250/362 |
| 2014/0103196 | A1* | 4/2014 | Soga | G01S 7/4865 250/208.2 |

FOREIGN PATENT DOCUMENTS

| | | |
|---|---|---|
| JP | A-11-037850 | 2/1999 |
| JP | A-11-037851 | 2/1999 |
| JP | A-2004-144734 | 5/2004 |
| JP | A-2004-303266 | 10/2004 |
| JP | A-2005-257453 | 9/2005 |
| JP | A-2010-091378 | 4/2010 |
| JP | A-2011-97581 | 5/2011 |
| JP | A-2011-247872 | 12/2011 |
| JP | A-2012-037267 | 2/2012 |
| JP | A-2012-060012 | 3/2012 |
| JP | A-2012-098103 | 5/2012 |

OTHER PUBLICATIONS

Aug. 26, 2014 Office Action issued in Japanese Application No. 2012-228619 (with translation).

Niclass et al. "A 100m-Range 10-frame/s 340×96-pixel Time-of-Flight Depth Sensor in 0.18 µm CMOS", *Proceedings of the ESSCIRC*, pp. 107-110, disclosed Sep. 12, 2011.

* cited by examiner

LIGHT DETECTOR

PRIORITY INFORMATION

This application claims priority to Japanese Patent Application No. 2012-228619, filed on Oct. 16, 2012, which is incorporated herein by reference in its entirety.

BACKGROUND

1. Technical Field

The present invention relates to a light detector.

2. Background Art

In order to reduce traffic accidents or the like, vehicles equipped with a collision prevention system or the like are being developed. In such a system, sensors such as cameras, a millimeter wave radar, or the like for monitoring the external road environment are used.

A stereo camera has a relatively wide field of view and high spatial resolution, but the distance precision is significantly reduced at a far distance. On the other hand, the millimeter wave radar can detect a target which is about 200 m away, but the millimeter wave radar has a narrow field of view and low angular resolution.

In contrast, an optical rangefinder based on a time of flight (TOF) method has high spatial resolution (angular resolution) and can measure a distance with a wide field of view and a long distance. Because of this, such a rangefinder can improve precision and enhance robustness to detect a driving path and obstacles, and thus, functions of the safety system can be expanded. For example, if an obstacle at a far distance can be detected with higher position precision, a warning can be activated earlier. In addition, if a shape of a parked vehicle or the like can be detected with high precision, it can be reliably judged if a collision will occur.

In such an optical rangefinder based on TOF, an avalanche photodiode (APD) or a PIN photodiode is typically used as a light detector. When a photon falls on the APD, an electron-hole pair is generated, the electrons and the holes are accelerated with a high electric field, causing impact ionization, and new electron-hole pairs cause impact ionization one after another in a manner similar to an avalanche. Because the sensitivity is improved by this internal amplification, the APD is often used, especially in a case where a long-distance detection is desired. Operation modes of the APD include a linear mode in which the APD is operated with a reverse bias voltage at a voltage slightly less than a breakdown voltage, and a Geiger mode in which the APD is operated with a reverse bias voltage at a voltage of greater than the breakdown voltage. In the linear mode, a ratio of the electron-hole pairs which disappear (which exit from the high-electric field region) is higher than a ratio of the electron-hole pairs which are generated, and thus, the avalanche stops naturally. An output current is approximately proportional to the amount of incident light, and the device is used for measurement of the amount of incident light. In the Geiger mode, because the avalanche phenomenon can be caused with incidence of only a single photon, the device is also referred to as a single photon avalanche diode (SPAD).

An optical rangefinder based on TOF can also output brightness information in addition to the distance information. The detected light includes light which is illuminated by the rangefinder and reflected on an object, ambient light such as sunlight which is reflected on an object, and light which is radiated from an object. In the case of a light detector that outputs a value which is approximately proportional to the amount of incident light, the peak of the light signal can be assumed to be the reflection, and the reflection can be identified by extracting the peak. The peak value of the light signal can be corrected with a measured distance, to determine reflectivity of the target. By contrast, the light other than the illuminated light; that is, the disturbance light, can be measured from the output of the light detector during a laser stopping period (JP 2011-247872 A).

On the other hand, in the case of the light detector of a photon-counting type, the brightness information can be measured from the TOF histogram. A total of the histogram values is a full amount of detected light, and the peak value is the reflected light of the illuminated light. In addition, information of the disturbance light can be obtained from the output of the light detector during the laser stopping period (JP 2010-91378 A).

When the light detector is used outdoors, a wide dynamic range is required. A brightness varies a lot in the outdoor environment, because the illuminance exceeds 100,000 lux in fine weather during daytime and the illuminance is about a few tens of lux under a street lamp during the nighttime. Since variation of the target reflectivity should be also considered, a dynamic range of about 6 orders of magnitude is required. When the amount of light is detected with the photon count, the number of counts is approximately proportional to the amount of light when the amount of light is low. When the amount of light is increased, the photons incident interval gets shorter than an output voltage pulse width. Then, a plurality of voltage pulses may be merged and thus, the number of counts could be reduced. Therefore, as shown in FIG. 8, the number of counts cannot monotonically increase in accordance with the amount of light, and the amount of light cannot be accurately measured.

Thus, the light detector is repeatedly reset by a resetting mean, it is detected if there is one or more incident photons between the reset pulses, and the detected binary result is accumulated for a predetermined period. With this process, because the number of necessary bits for the counting is reduced, the dynamic range can be enlarged (JP 7-067043 A). There is also another disclosed method in which an analog detection signal of a photon counter is converted to a digital signal. When the digital signal is greater than or equal to a threshold, the signal is simply forwarded to a later stage of a counting circuit. When the digital signal is less than or equal to the threshold, a predetermined value is sent to the later stage. In the counting circuit, an amount of light is calculated based on an integration of the waveform of the obtained detection signal until the amount-of-light measurement is completed (JP 2012-37267 A).

In the related art (JP 7-067043 A), when the light detector is reset, the time required for the reset is not considered, but actually, the reset requires a certain amount of time, which is the time required for recharging a parasitic capacitance of the photodiode with charges and biasing the photodiode to a predetermined voltage. The reset time becomes a dead-time in which photons cannot be detected, and, as shown in FIG. 9, when the sampling interval is shortened, a ratio of active time during which the photons can be detected; that is, an efficiency of detection time, is reduced. On the other hand, if the sampling interval is elongated, a ratio of the active time during which the photons can be detected can be increased, but the detection result is easily saturated, and, consequently, the dynamic range is reduced.

In addition, in the related art (JP 2012-037267 A), because an output waveform integration is also varied when the detection sensitivity of the light detector varies with temperature, the amount of light cannot be accurately detected.

In addition, the noise level also varies with temperature, and, thus, the threshold cannot be suitably defined.

SUMMARY

According to one aspect of the present invention, there is provided a light detector comprising a light-receiving unit having a light-receiving element of a photon-counting type that receives incident light and outputs a binary pulse indicating presence or absence of photon incidence, and an accumulating unit in which a total of a pulse width of the pulse is integrated or accumulatively summed over a measurement period.

According to another aspect of the present invention, preferably, the light detector further comprises a sampling unit that samples the pulse at an interval less than the pulse width of the pulse, wherein the accumulating unit comprises a counting unit that counts a sampled value of the sampling unit over the measurement period.

According to another aspect of the present invention, preferably, in the light detector, the light-receiving unit is of an array type in which a plurality of the light-receiving elements are arranged, the light detector further comprises an adder unit that sums pulses which are output from the plurality of the light-receiving elements, and the accumulating unit integrates or accumulatively sums an output of the adder unit over the measurement period.

According to another aspect of the present invention, preferably, the light detector further comprises a correction unit that converts the output value into a form which is proportional to an amount of incident light.

According to another aspect of the present invention, preferably, in the light detector, the light-receiving element includes an avalanche photodiode in a Geiger mode.

BRIEF DESCRIPTION OF THE DRAWINGS

Preferred embodiment(s) of the present invention will be described in detail based on the following figures, wherein.

DESCRIPTION OF EMBODIMENTS

Figure 6:
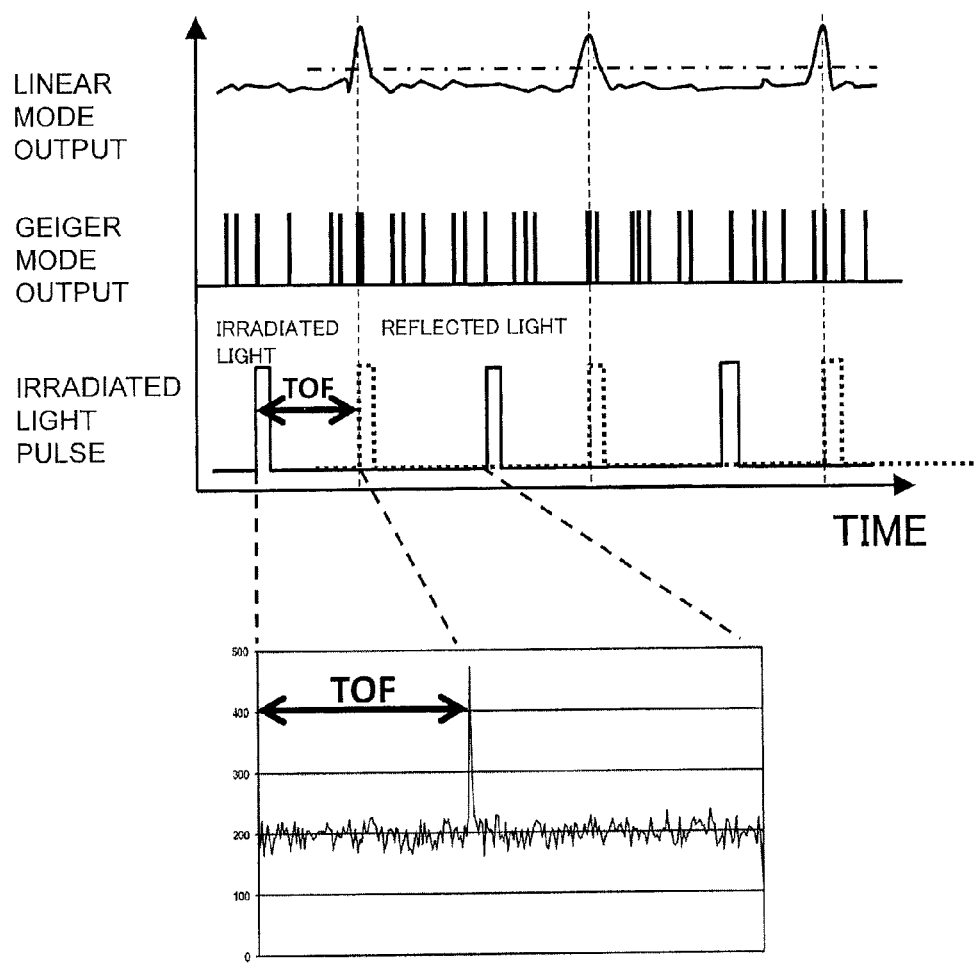
FIG. 6 is a diagram showing a measurement method of TOF.

FIG. 6 shows a TOF measurement method for determining elapsed time for light illuminating a target to be reflected by the target and return. In this process, because the light other than the light illuminated by the rangefinder is noise, disturbance light such as the solar light must be removed. When a light-receiving element that obtains an output which is approximately proportional to the amount of incident light, is used, TOF can be identified by thresholding the output after the DC component is suppressed for eliminating disturbance light. On the other hand, when a photon-counting type light-receiving element that outputs a voltage pulse for photon incidence, is used, the time of the voltage pulse is repeatedly measured to create a histogram, and a peak value thereof is extracted. With such a process, an accurate TOF measurement can be made even if there is disturbance light.

Figure 2:
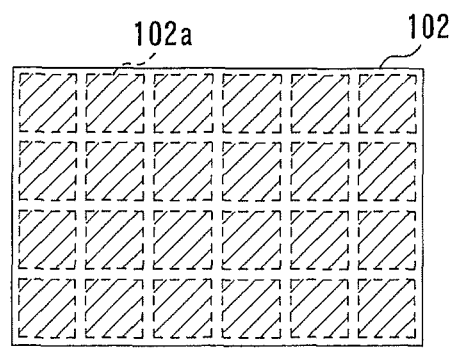
FIG. 2 is a diagram showing an example layout of a light-receiving unit in a preferred embodiment of the present invention.
Figure 7:
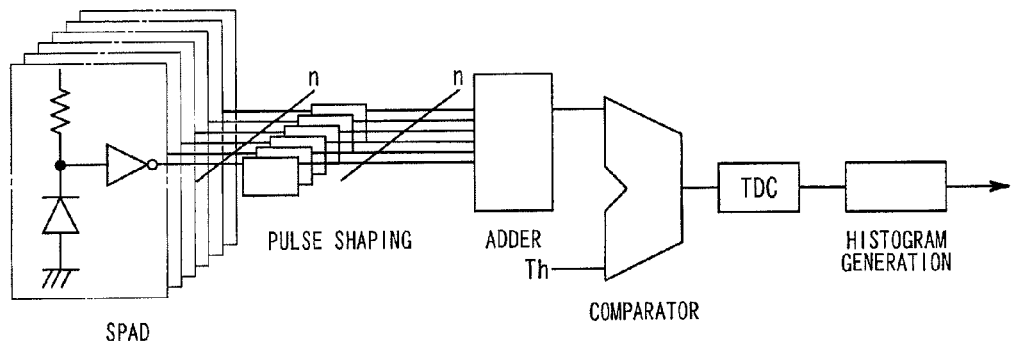
FIG. 7 is a diagram showing a configuration of a light detector of the related art.
Figure 8:
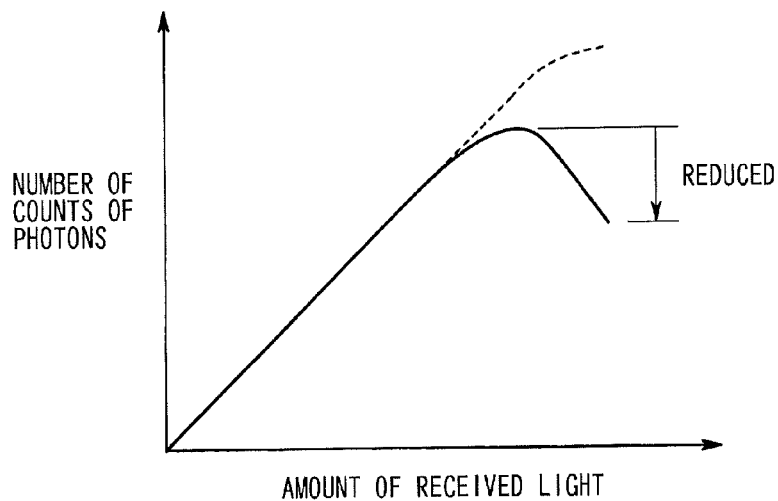
FIG. 8 is a diagram for explaining an operation of a light detector of the related art.
Figure 9:
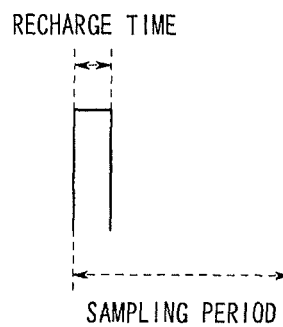
FIG. 9 is a diagram for explaining a problem in a light detector of the related art.
Figure 9:
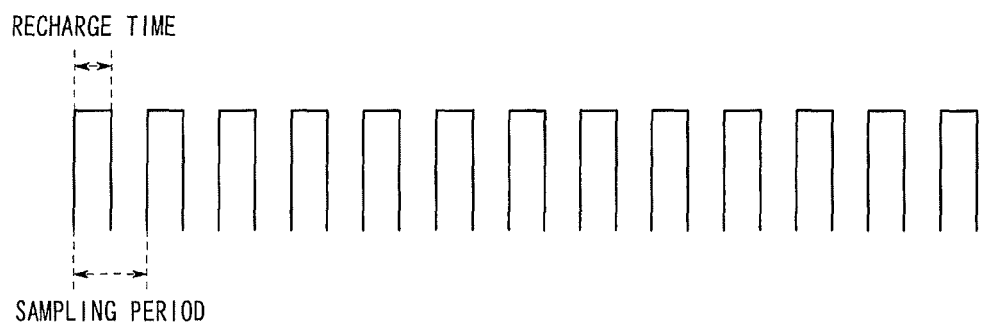

In order to extract the peak value of the TOF histogram with high precision, a large number of times of voltage pulses are required, and, consequently, the total measurement time has to be elongated. When the measurement time is elongated, in the case that the target moves, the distance to the target changes, and a measurement error would be caused. In order to shorten a total measurement time to accurately determine TOF without influence of the disturbance light, methods using silicon photomultipliers (SiPM) are disclosed (JP 2012-60012 A and C. Niclass, M. Soga, H. Matsubara, S. Kato, "A 100 m-range 10-frame/s 340×96-pixel time-of-flight depth sensor in 0.18 μm CMOS", Proceedings of the ESSCIRC, pp. 107-110, September, 2011). In SiPM, a plurality of SPADs are arranged in an array configuration, to form a large light detector. FIG. 7 shows an example configuration of a TOF detecting circuit using SiPM. By a comparator placed at an output of the SiPM, the TOF is measured only when more than a predetermined number of SPADs output pulses simultaneously; that is, when a large number of photons simultaneously enter a light detector (in FIG. 2, greater than or equal to a threshold Th). With such a configuration, a response to the photons of the disturbance light can be reduced, and the TOF of the reflected light can be accurately extracted with a smaller number of measurements. This is based on an idea that while a large number of photons simultaneously come from the illuminated light, it is unlikely that photons from the disturbance light come simultaneously, because the photons of the disturbance light come at random timings.

Figure 1:
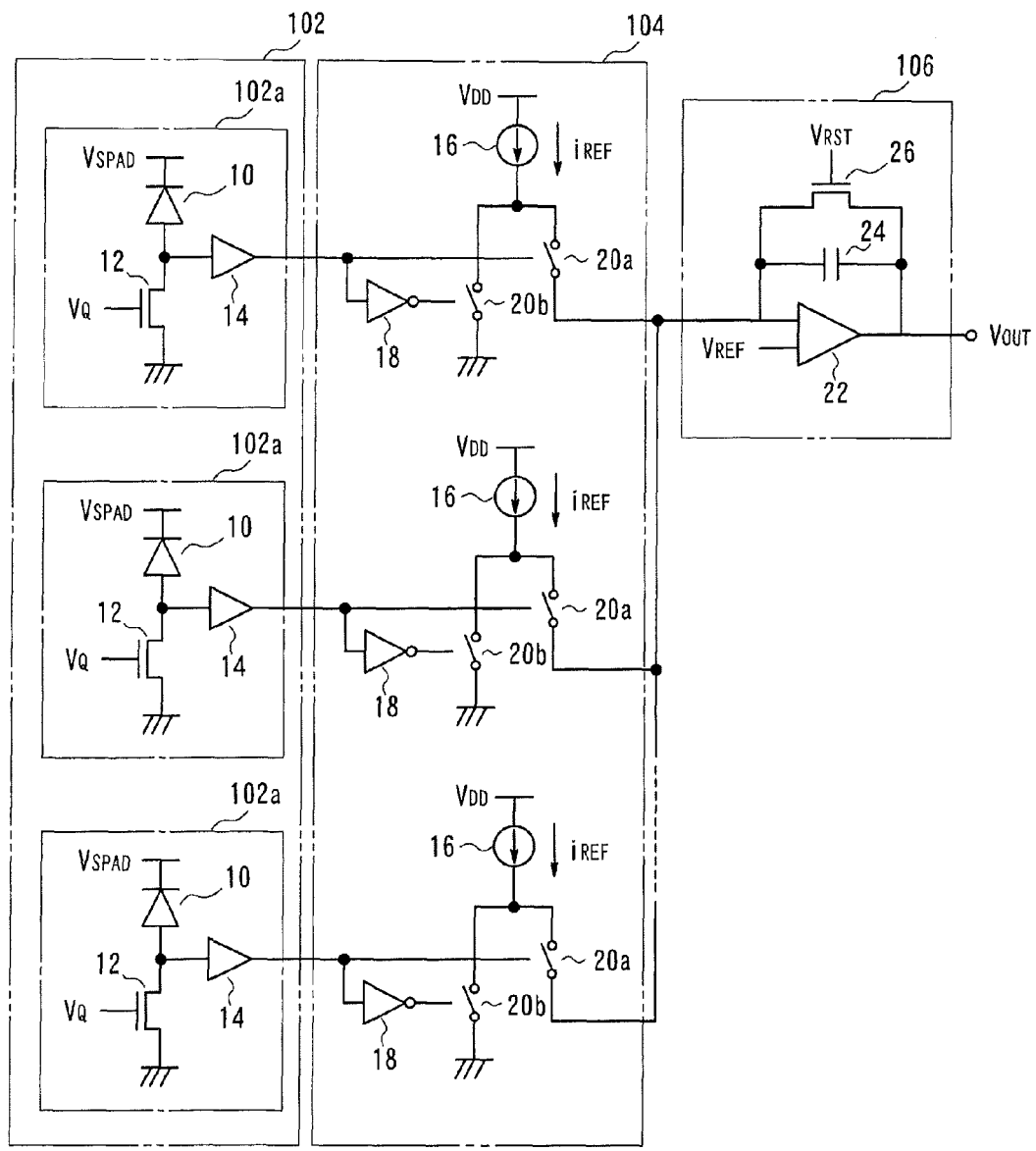
FIG. 1 is a diagram showing a configuration of a light detector according to a preferred embodiment of the present invention.

As shown in FIG. 1, a light detector 100 in a preferred embodiment of the present invention comprises a light-receiving unit 102, a voltage-current conversion unit 104, and an integrating unit 106.

The light-receiving unit 102 comprises a photodiode 10, a quenching resistor 12, and a buffer 14.

The photodiode 10 is a single photon avalanche diode (SPAD) in a Geiger mode. That is, in the photodiode 10, with a bias voltage of greater than the breakdown voltage, an avalanche phenomenon is caused with incidence of a single photon, to output a voltage pulse upon incidence of the photon.

The quenching resistor 12 is a resistive element for stopping the avalanche phenomenon of the SPAD. In the present embodiment, the quenching resistor 12 is implemented with a resistive component of a transistor. In the photodiode 10, the avalanche phenomenon can be stopped by reducing the bias voltage down to the breakdown voltage. The stopping of the avalanche phenomenon by reducing the applied voltage is called quenching, and the simplest quenching circuit is realized by connecting the quenching resistor 12 in series with the photodiode 10. When an avalanche current is generated, the voltage between the terminals of the quenching resistor 12 is increased, causing a reduction in the bias voltage of the photodiode 10. When the bias voltage is reduced to the breakdown voltage, the avalanche phenomenon is stopped. When the avalanche current stops flowing, the terminal voltage of the quenching resistor 12 is reduced, and a bias voltage of greater than the breakdown voltage is again applied to the photodiode 10.

The buffer 14 is provided for extracting the up-down of the voltage between the terminals of the quenching resistor 12. With this element, the photon incidence on the photodiode 10 can be detected as a voltage pulse.

During the time corresponding to the pulse width of the voltage pulse, the bias voltage of the SPAD is reduced, and, thus, the time period is a dead-time in which the avalanche phenomenon cannot be newly induced even when a new photon is incident, and the photons cannot be detected.

A light-receiving element 102a consists of the photodiode 10, the quenching resistor 12, and the buffer 14, and the light-receiving unit 102 includes a plurality of the light-receiving elements 102a. Therefore, the light-receiving unit 102 is configured as silicon photomultipliers (SiPM). In FIG. 1, an example configuration is shown in which the light-receiving unit 102 includes three light-receiving elements 102a, but the number of the light-receiving elements 102a is not limited to this number. For example, as shown in a planar schematic diagram of FIG. 2, a configuration, in which the light-receiving elements 102a are arranged in an array of 4 (vertical)×6 (lateral), may be employed. In this case, a total light-receiving area is increased and a larger amount of light can be received.

The voltage-current conversion unit 104 comprises a current source 16, an inverter 18, and switching elements 20a and 20b. The switching elements 20a and 20b can be formed with transistors.

When a photon is incident on the photodiode 10, a voltage pulse is output from the buffer 14. During the time when the voltage pulse is "high," the switching element 20a is switched ON and the switching element 20b is switched OFF. During the time when the switching element 20a is ON, a current $i_{REF}$ is input by the current source 16 to the integrating unit 106.

A voltage-current conversion unit 104 consists of the current source 16, the inverter 18, and the switching elements 20a and 20b. It is provided for each light-receiving element 102a. Therefore, the voltage pulses from all light-receiving elements 102a are converted into current pulses by the voltage-current conversion units 104, and then summed and supplied to the integrating unit 106.

The integrating unit 106 comprises a comparator 22, a capacitor 24, and a reset switch 26. The comparator 22 and the capacitor 24 are connected in parallel, and form an integrating circuit that outputs, as a voltage $V_{out}$, a value integrating the currents which are supplied from the voltage-current conversion units 104. The reset switch 26 clears charges accumulated in the capacitor 24 to reset the integrating unit 106 when the reset switch 26 is switched ON. The integrating unit 106 outputs an integrated value as a voltage $V_{out}$, from the reset to a time when a predetermined measurement period has elapsed. The measurement period may be a constant period defined in advance or may be changed according to a measurement result. For example, the measurement period from a reset to a next reset may be shortened as the voltage $V_{out}$ becomes higher.

The photodiode 10 which is the SPAD in the Geiger mode theoretically has an infinite gain, the amplified current value does not contain information, and presence or absence of the avalanche phenomenon by photon incidence is output as binary information (voltage pulse). Therefore, it is robust with respect to a variation of gain due to temperature or the like.

Figure 3:
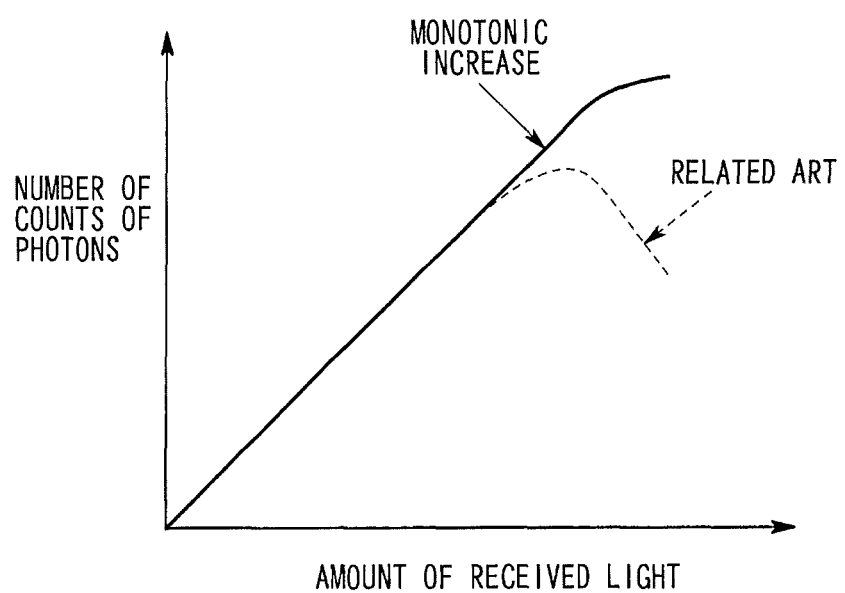
FIG. 3 is a diagram for explaining an operation of a light detector according to a preferred embodiment of the present invention.

In the light detector 100 in the present embodiment, the voltage pulses of all photodiodes 10 are converted into current pulses, and then summed, and integrated over time at the integrating unit 106. That is, when the number of incident photons is small (when the amount of incident light is small), an output voltage Vout is in proportion to the total pulse width of the voltage pulses of all photodiodes 10. When the number of incident photons is increased (when the amount of incident light is increased), the frequency of the output voltage pulse from the photodiode 10 is increased, and the probability, that the plurality of voltage pulses are merged, is increased. When the voltage pulses are merged, the number of pulses is reduced. However, in the present embodiment, the accumulated value (total time) of the pulse widths of the voltage pulses; that is, the voltage Vout which is the integrated value at the integrating unit 106, always increases with increase of photon incidence. Therefore, as shown in FIG. 3, a wide dynamic range output, which always monotonically increases with the increase of the amount of incident light, can be obtained.

As described, in the light detector 100 of the present embodiment, binary information (a voltage pulse) is output for incidence of a photon, and the light detector 100 is robust with respect to a variation of temperature or the like. Therefore, the total time of the pulse widths of the voltage pulses is not affected by the variation of the internal amplification gain or the like, and a stable light detection can be achieved independently of the temperature.

In addition, because a total time of the pulse widths of the voltage pulses from a plurality of the light-receiving elements 102a is output as the amount of light, the dynamic range can be further expanded as compared to a configuration having only one light-receiving element 102a.

Moreover, because the avalanche photodiode in the Geiger mode is used for the light-receiving element 102a, the light detector can be equipped on a device with a lower cost and a smaller size compared to another photon-counter type light-receiving element such as a photomultiplier tube. Furthermore, because the avalanche photodiode is a semiconductor element, the plurality of light-receiving elements 102a can be easily integrated. In addition, because a technique for realizing the avalanche diode with a CMOS process, is also developed, the diode can be implemented on a same chip with the integrating unit 106 or the like. With this configuration, the manufacturing step can be simplified and the cost of manufacturing can be reduced. Moreover, because the parasitic capacitance of the avalanche photodiode is reduced, the dead-time can be shortened and the dynamic range can be further expanded.

A configuration has been described in which the light-receiving unit 102 includes a plurality of light-receiving elements 102a, but a similar effect of the dynamic range expansion can be obtained even by a configuration with only one light-receiving element 102a. In this case, one light-receiving element 102a and one voltage-current conversion unit 104a are connected to the integrating unit 106.

<Alternative Configuration>

In the above-described embodiment, a configuration is employed in which the output of the light-receiving unit 102 is output as an integrated value of the current, but alternatively, digital processing may be applied.

Figure 4:
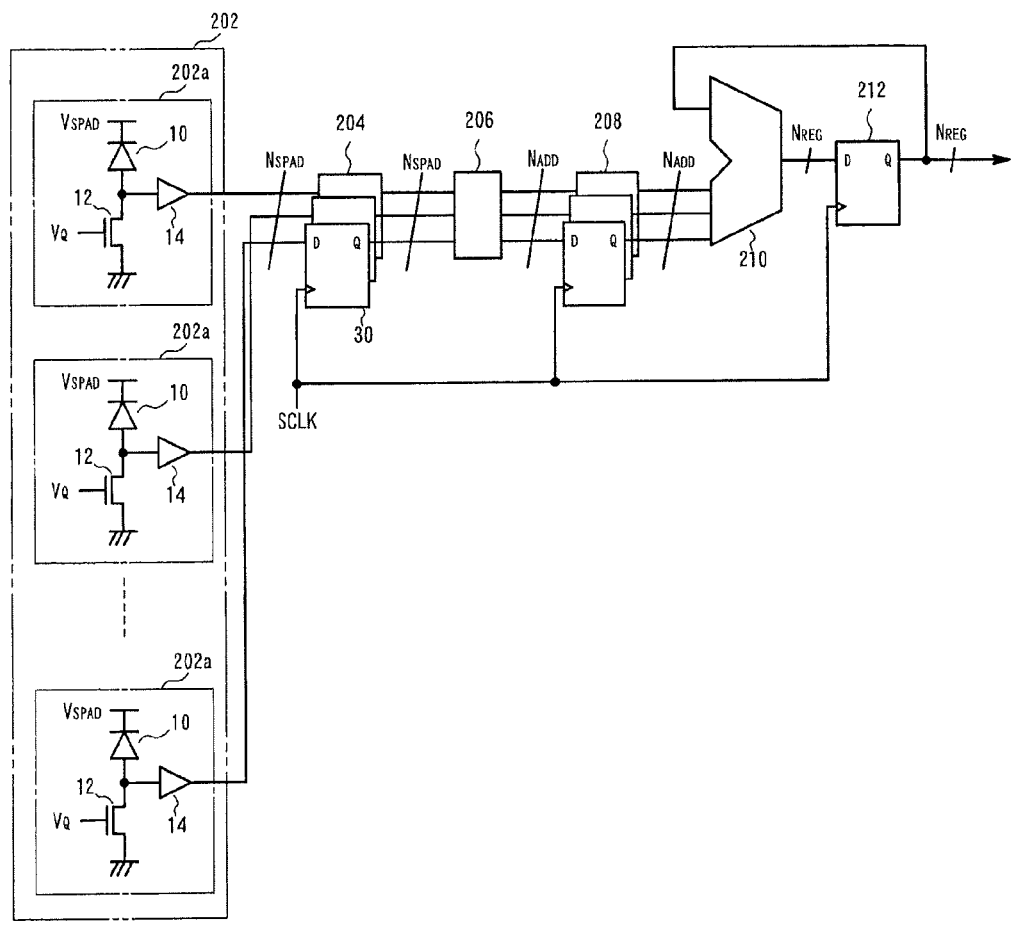
FIG. 4 is a diagram showing an alternative configuration of a light detector according to a preferred embodiment of the present invention.

As shown in FIG. 4, a light detector 200 in an alternative embodiment of the present invention comprises a light-receiving unit 202, a first sampling unit 204, an adder unit 206, a second sampling unit 208, an accumulating unit 210, and a latch unit 212.

Similar to the above-described embodiment, the light-receiving unit 202 comprises the photodiode 10, the quenching resistor 12, and the buffer 14. The light-receiving unit 202 has similar functions as those of the light-receiving unit 102. A light-receiving element 202a consists of the photodiode 10, the quenching resistor 12, and the buffer 14. FIG. 4 shows an example configuration where the light-receiving unit 202 includes three light-receiving elements 202a. The number of the light-receiving elements 202a is not limited to this number, and a single light-receiving element 202a may be employed or a plurality of light-receiving elements 202a may be formed in an array form.

Figure 5:
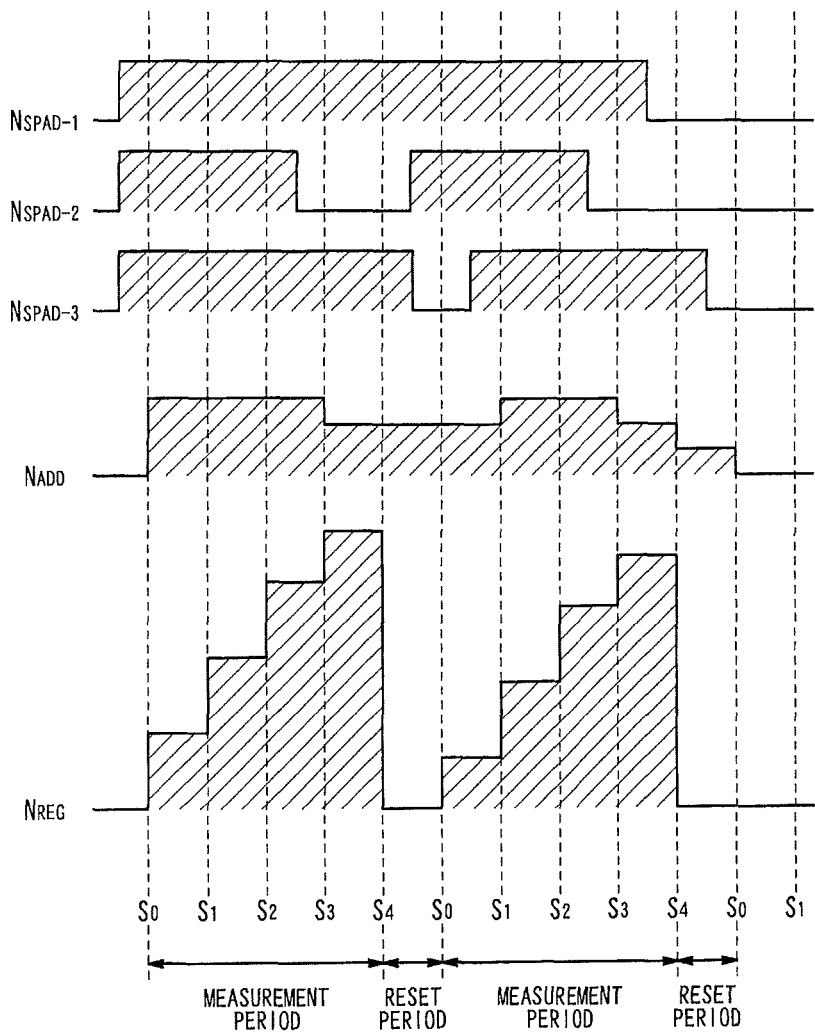
FIG. 5 is a diagram for explaining an operation of an alternative configuration of a light detector according to a preferred embodiment of the present invention.

The first sampling unit 204 includes a circuit which temporarily holds an output from the light-receiving unit 202. The first sampling unit 204 may be realized, for example, by a D flip-flop 30. When the light-receiving unit 202 includes a plurality of light-receiving elements 202a, the D flip-flop 30 is provided for each light-receiving element 202a. The first sampling unit 204 samples the binary output signal (pulse voltage; $N_{SPAD}$) which is output from the light-receiving element 202a included in the light-receiving unit 202, in synchronization with a clock SCLK, and outputs a held value. A sampling frequency is preferably greater than or equal to the Nyquist frequency of the voltage pulse which is output by the light-receiving element 202a, and is preferably greater than or equal to twice an inverse of the voltage pulse width. For example, as shown in FIG. 5, at the timings S0, S1, S2, . . . of the clock SCLK, the voltage pulse (binary output) from each light-receiving element 202a is sampled.

The adder unit 206 sums the outputs from the first sampling units 204, and outputs a summed result (bit width: $N_{ADD}=[\log_2 (N_{SPAD})]$). With the adder unit 206, the voltage pulses which are output from the plurality of light-receiving elements 202a at the same timing are summed together. For example, when two voltage pulses of the plurality of light-receiving elements 202a included in the light-receiving unit 202 are at the HIGH level, the output from the adder unit 206 would be "2 (decimal)"="10 (binary)." The second sampling unit 208 samples the signal which is output from the adder unit 206 every time the clock SCLK is input, and outputs a held value.

The accumulating unit 210 further accumulates the summed result which is output from the adder unit 206 and held by the second sampling unit 208 over a predetermined measurement time T, and outputs the resulting value. The accumulating unit 210 may be formed by an accumulator. The accumulating unit 210 outputs an accumulated value (bit width: $N_{REG}=[\log_2 (N_{SPAD} \cdot T \cdot f_{SCLK})]$) in which the summed values of the outputs of the plurality of light-receiving elements 202a are further time-integrated over the measurement time T. The accumulated value is a value which always monotonically increases with an increase of the pulse widths of the voltage pulses of the plurality of light-receiving elements 202a. In FIG. 5, the timings S0-S4 of the clock SCLK are set as one measurement period, S4-S0 is set as the reset time, and a process which repeats the measurement and the reset is shown.

Specifically, in the case where the number of incident photons is small (amount of incident light is small), an accumulated value which is proportional to a total of the pulse widths of the voltage pulses of all photodiodes 10 is output from the accumulating unit 210. When the number of incident photons is increased (amount of incident light is increased), the frequency of output of the voltage pulse from the photodiode 10 is increased, and the probability that the plurality of voltage pulses are merged would be gradually increased. When the voltage pulses are merged, the number of pulses would be reduced, but the accumulated value (total time) of the pulse widths of the voltage pulses at the accumulating unit 210 always increases with increase of photon incidence. Therefore, a wide dynamic range output, which always monotonically increases with the increase of the amount of incident light, can be obtained.

The latch unit 212 samples the output of the accumulating unit 210 every time the clock SCLK is input, and outputs the held value.

As described, in the light detector 200 of the present configuration, binary information (voltage pulse) is output for photon incidence, and the light detector 200 is robust with respect to a variation such as that of the temperature. Therefore, the total time of the pulse widths of the voltage pulses is not affected by the variation such as that of the internal amplification gain or the like, and a stable light detection independent of the temperature can be realized.

Moreover, because the total time of the pulse widths of the voltage pulses from the plurality of light-receiving elements 202a is output as the amount of light, the dynamic range can be further expanded as compared to a configuration having only one light-receiving element 202a.

In particular, the voltage pulse is sampled over a predetermined measurement period and the number of times the voltage pulse has become the "HIGH level (1)" is counted. Because a digital processing is applied in this manner, a signal process which is robust against every noise can be enabled. In addition, because the summation process or the like is applied after the outputs of the plurality of light-receiving elements 202a are sampled, the dynamic range can be expanded with a simple digital circuit.

Moreover, because the avalanche photodiode in the Geiger mode is used as the light-receiving element 202a, the light detector can be equipped on a device with a lower cost and a smaller size as compared to the other photon-counter type light-receiving elements such as the photomultiplier tube. In addition, because the avalanche photodiode is a semiconductor element, the plurality of light-receiving elements 202a can be easily integrated. Moreover, because a technique for realizing the avalanche photodiode with a CMOS process, is also developed, the light-receiving element can be implemented on the same chip with the first sampling unit 204, the adder unit 206, the second sampling unit 208, the accumulating unit 210, the latch unit 212, or the like. With this configuration, the manufacturing process can be simplified and the manufacturing cost can be reduced. In addition, because the parasitic capacitance of the avalanche photodiode is reduced, the dead-time can be shortened and the dynamic range can be further expanded.

In the above, a configuration is employed in which the light-receiving unit 202 includes a plurality of light-receiving elements 202a. However, the effect of the dynamic range expansion can be similarly obtained even in a structure having only one light-receiving element 202a. In this case, one light-receiving element 202a is connected to the second sampling unit 208, the accumulating unit 210, and the latch unit 212.

In the light detector 100 of the preferred embodiment of the present invention and in the light detector 200 of the alternative configuration, the output is a signal which monotonically increases with the increase of the amount of received light, but does not have a value proportional to the amount of light. Therefore, a correction process may be applied such that the output of the light detector has a value proportional to the amount of received light. For example, a function process may be applied so that the output of the light detector has a value proportional to the amount of received light, or a process using a lookup table may be applied. The function or the lookup table may be determined in advance by surveying a correlation relationship between the amount of received light and the output of the light detector in a state where the amount of received light can be accurately known.

What is claimed is:

1. A light detector comprising:
a light-receiving unit having a light-receiving element of a photon-counting type that receives incident light and outputs binary pulses, each of which indicates presence or absence of photon incidence;
an accumulating unit in which a total of pulse widths of the pulses is integrated or accumulatively summed over a measurement period;
a sampling unit that samples each of the plurality of pulses at an interval less than the pulse width of the respective pulse; and
a counting unit that counts a sampled value of the sampling unit over the measurement period, wherein the counted value denotes a total of pulse widths of the pulses,
wherein an output of the light detector is monotonic and lacks a value proportional to the amount of incident light received, and a correction unit corrects the output so as to be proportional to the amount of incident light received.

2. The light detector according to claim 1, wherein
the light-receiving unit is of an array type in which a plurality of the light-receiving elements are arranged,
the light detector further comprises an adder unit that sums pulses which are output from the plurality of the light-receiving elements, and
the accumulating unit integrates or accumulatively sums an output of the adder unit over the measurement period.

3. The light detector according to claim 1, wherein the light-receiving element includes an avalanche photodiode in a Geiger mode.

4. The light detector according to claim 2, wherein the light-receiving element includes an avalanche photodiode in a Geiger mode.

5. The light detector according to claim 1, wherein the correction unit surveys a predetermined correlation relationship between the amount of incident light received and the output of the light detector.

6. The light detector according to claim 5, wherein the correction unit uses a lookup table to survey the predetermined relationship.

* * * * *